United States Patent
Baek et al.

(10) Patent No.: US 7,262,073 B2
(45) Date of Patent: Aug. 28, 2007

(54) CMOS IMAGE SENSOR AND METHOD OF MANUFACTURING SAME

(75) Inventors: Hyoun-Min Baek, Yongin-si (KR); Duk-Min Yi, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 11/207,759

(22) Filed: Aug. 22, 2005

(65) Prior Publication Data

US 2006/0054946 A1 Mar. 16, 2006

(30) Foreign Application Priority Data

Sep. 11, 2004 (KR) ............... 10-2004-0072819

(51) Int. Cl.
*H01L 21/00* (2006.01)
(52) U.S. Cl. ................... 438/70; 257/E21.637
(58) Field of Classification Search ............ 438/69, 438/70, 71, 72; 257/E21.637
See application file for complete search history.

(56) References Cited

U.S. PATENT DOCUMENTS

2004/0140564 A1* 7/2004 Lee et al. ............ 257/758

FOREIGN PATENT DOCUMENTS

| JP | 09-045885 | 2/1997 |
| JP | 2000-164839 | 6/2000 |
| JP | 2003-007988 | 10/2003 |
| JP | 2003-332548 | 11/2003 |
| KR | 100172849 B1 | 10/1998 |

* cited by examiner

*Primary Examiner*—Chandra Chaudhari
(74) *Attorney, Agent, or Firm*—Valentine & Whitt, PLLC

(57) ABSTRACT

Disclosed are a complementary metal oxide semiconductor (CMOS) image sensor and a method of forming the same. The CMOS image sensor comprises a semiconductor substrate having a photodiode region and a transistor region. An optical path is formed between a micro lens on the photodiode region and a photodiode formed on the semiconductor substrate. The optical path comprises an inner lens formed between an intermetal insulation layer on the photodiode region and a transparent optical region formed on the inner lens. The transparent optical region generally has a different refractive index from the inner lens.

19 Claims, 8 Drawing Sheets

CMOS IMAGE SENSOR AND METHOD OF MANUFACTURING SAME

BACKGROUND OF THE INVENTION

1. Field of the Invention

The present invention relates generally to a complementary metal oxide semiconductor (CMOS) sensor and a method for manufacturing the same. More particularly, the invention relates to a CMOS sensor having an inner lens located in a planarized insulation layer thereof and a method of manufacturing the same.

A claim of priority is made to Korean Patent Application No. 10-2004-0072819 filed on Sep. 11, 2004, the disclosure of which is hereby incorporated by reference in its entirety.

2. Description of the Related Art

Complementary metal oxide semiconductor (CMOS) image sensors are commonly used in various digital imaging applications such as digital cameras and the like. A typical CMOS image sensor includes a light sensing block receiving incident light and a logic block converting the incident light into electrical signals.

CMOS image sensors provide various advantages over competing digital imaging technologies. For example, CMOS image sensors are relatively power efficient and they are readily integrated with other devices on a single chip.

In recent years, CMOS image sensor technology has improved in a number of ways. For example, the optical sensitivity of CMOS image sensors has been improved by increasing a fill factor thereof. Fill factor is a ratio representing the relative amount of a CMOS image sensor occupied by the light sensing block. The fill factor is generally limited by the amount of space on the sensor occupied by the logic block. Hence, the fill factor can be increased by reducing the size of the logic block.

Although the typical size of the logic block in CMOS image sensors has decreased over the years, the corresponding increase in optical sensitivity has been somewhat limited by a corresponding increase in the resolution of the CMOS image sensors. In other words, although the logic blocks have become smaller, modern devices now incorporate more of the logic blocks. As a result, additional measures are needed to improve the optical sensitivity of the CMOS image sensors.

One way to improve the optical sensitivity of a CMOS image sensor includes placing a micro lens on the light sensing block to concentrate incident light thereon. One problem with the micro lens, however, is that its effectiveness is limited by properties of an optical path between the micro lens and the light sensing block.

Various devices and methods have been introduced to improve the concentration of incident light on the light sensing block through the micro lens. Many of these techniques have focused on modifying the optical path between the micro lens and a photodiode in the image sensing block. For example, a dual lens structure is disclosed in U.S. Pat. No. 5,796,154 and a semiconductor array imaging device is disclosed in U.S. Pat. No. 6,171,885. Unfortunately, the above mentioned conventional devices require complicated and expensive fabrication processes.

In order to overcome at least these problems, new CMOS image sensors providing improved optical sensitivity and associated methods of manufacture are needed.

SUMMARY OF THE INVENTION

According to some embodiments of the invention, a CMOS image sensor is provided. According to other embodiments of the invention, a method of manufacturing a CMOS image sensor is provided. The CMOS image sensor provides increased optical sensitivity by concentrating incident light on a photodiode through an optical path including an inner lens between a micro lens and the photodiode.

According to one embodiment of the invention, CMOS image sensor comprises a substrate having a photodiode region and a transistor region, a photodiode formed on the photodiode region of the substrate, a plurality of transistors formed on the transistor region of the substrate, a planarized insulation layer covering the photodiode and the plurality of transistors, an intermetal insulation layer formed on the planarized insulation layer, and a metal wire layer formed on the transistor region, the metal wire layer penetrating the intermetal insulation layer. The CMOS image sensor further comprises an inner lens formed on the planarized insulation layer, the inner lens being formed opposite the photodiode as part of the intermetal insulation layer, and a transparent optical region covering the inner lens and penetrating the intermetal insulation layer on the photodiode region. The transparent optical region is preferably formed of a different material from the intermetal insulation layer.

According to another embodiment of the invention, a method of manufacturing a CMOS image sensor comprises forming a substrate having a photodiode region and a transistor region, forming a photodiode on the photodiode region, forming a transistor on the transistor region, forming a planarized insulation layer covering the photodiode and the transistor, forming an intermetal insulation layer covering the planarized insulation layer, and forming a metal wire layer on the transistor region, the metal wire layer penetrating the intermetal insulation layer. The method further comprises forming a cavity penetrating the intermetal insulation layer by removing a portion of the intermetal insulation layer on the photodiode region, forming an inner lens as a part of the intermetal insulation layer in the photodiode region, and forming a transparent optical region on the inner lens by filling the cavity.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
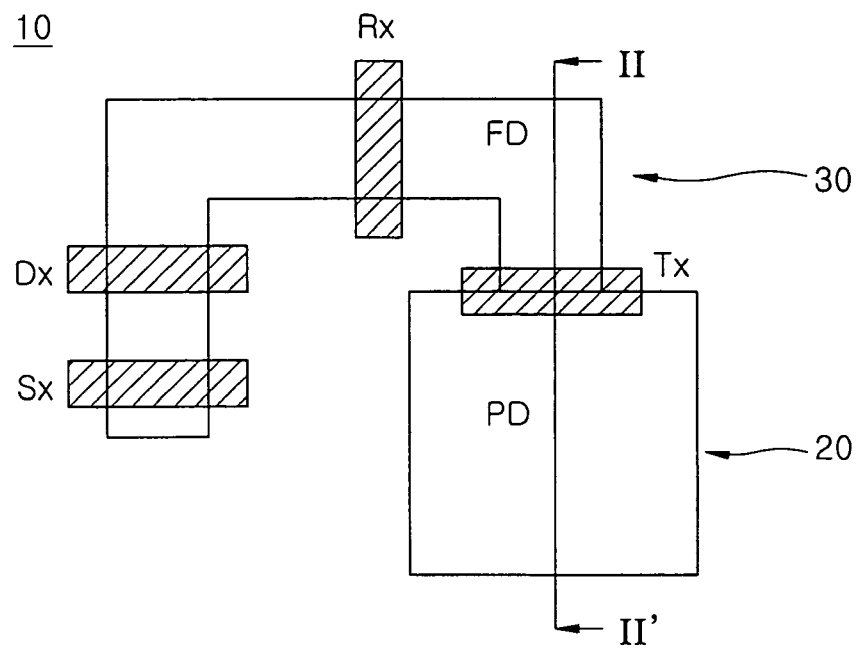
FIG. 1 is a diagram illustrating a pixel sensor of a CMOS image sensor in accordance with an embodiment of the present invention.

FIG. 1 is a diagram illustrating a pixel sensor of a CMOS image sensor in accordance with an embodiment of the present invention. The CMOS image sensor typically comprises an array of pixel sensors formed on a pixel array region of a semiconductor substrate.

Referring to FIG. 1, a pixel sensor 10 comprises a photodiode region 20 and a transistor region 30. Pixel sensor 10 receives light through a photodiode PD formed in photodiode region 20. The light received by photodiode PD is converted into electrical signals and transferred to transistors in transistor region 30.

Transistor region 30 includes a transfer transistor Tx transferring electric charges generated by photodiode PD to a floating diffusion region FD, a reset transistor Rx periodically resetting electric charges stored in floating diffusion region FD, a drive transistor Dx functioning as a source follower buffer amplifier for buffering a signal corresponding to electric charges in the floating diffusion region, and a select transistor Sx as a switch used to select pixel sensor 10.

In the embodiment shown in FIG. 1, pixel sensor 10 comprises one photodiode and four metal oxide semiconductor (MOS) transistors Tx, Rx, Dx, and Sx. However, the present invention is not limited to this structure. For example, in a different embodiment, the pixel sensor comprises a transfer transistor and a source follower buffer amplifier in the transistor region, and a photodiode in the photodiode region.

Figure 2:
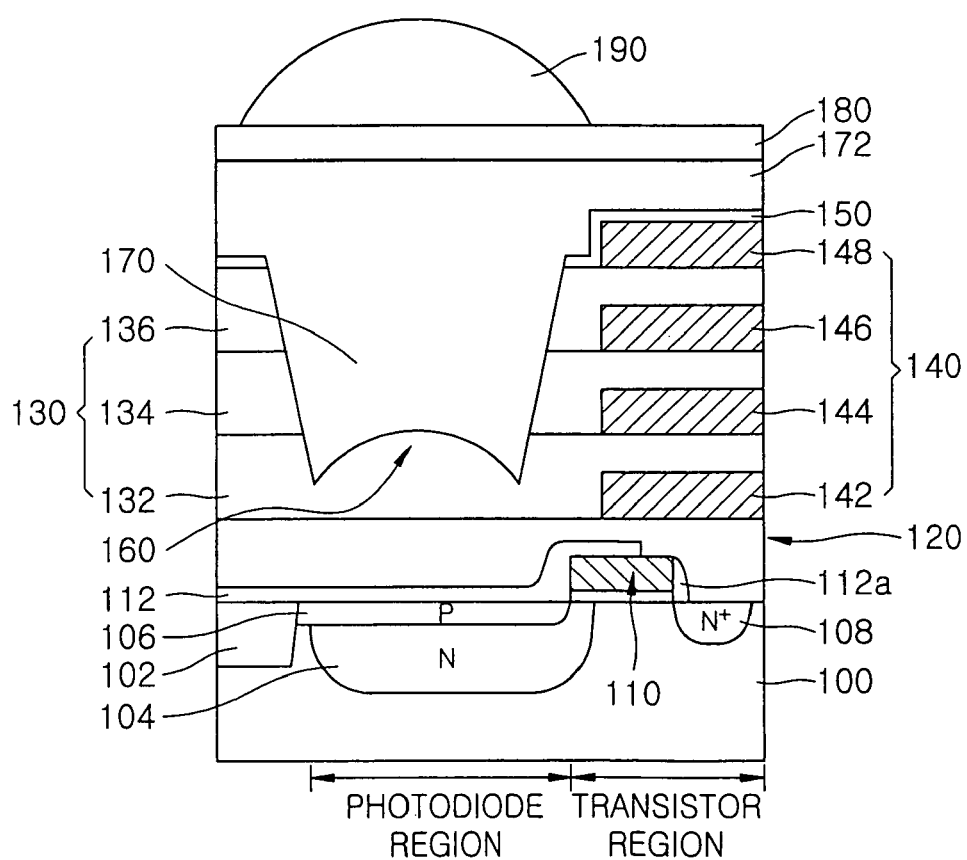
FIG. 2 is a cross-sectional view of the pixel sensor shown in FIG. 1 in accordance with one embodiment of the invention.

FIG. 2 is a cross-sectional view of pixel sensor 10 shown in FIG. 1. The view shown in FIG. 2 is taken along a line between points II and II' in FIG. 1.

Referring to FIG. 2, the pixel sensor comprises a semiconductor substrate 100 having a photodiode region and a transistor region. Semiconductor substrate 100 includes an active region defined by an isolation region 102.

The photodiode region includes an n-type photodiode 104 and a p+ type hole accumulated device (HAD) region 106 formed on photodiode 104. The transistor region includes a plurality of transistors 110 formed on semiconductor substrate 100. For simplicity of illustration, however, FIG. 2 shows only one transistor 110. Transistor 110 shown in FIG. 2 is a transfer transistor Tx transferring charge generated at photodiode 104 to a n+ type floating diffusion region 108.

Photodiode 104 and transistor 110 are covered by a planarized insulation layer 120. Planarized insulation layer 120 comprises an insulation layer 112 formed of a material identical to that forming an insulation spacer 112a at a sidewall of a gate of transistor 110.

In selected embodiments of the invention, planarized insulation layer 120 further comprises an insulation film having a salicide blocking layer (not shown) in the photodiode region. The insulation film may comprise, for example, a stacked structure including a medium temperature oxide (MTO) film and silicon nitride film. The salicide blocking layer is used as a mask to cover the photodiode during a salicide process used to form a metal salicide layer on gate, source and drain regions of transistors formed in the transistor region.

Planarized insulation layer 120 further comprises a capping layer (not shown) formed on transistor 110. The capping layer typically comprises a stacked structure including an undoped silicate glass (USG) film and a SiON film. Planarized insulation layer 120 still further comprises a plasma-enhanced tetraethylorthosilicated glass (PE-TEOS) film used as a top layer for planarizing the upper surface of planarized insulation layer 120.

An intermetal insulation layer 130 is formed on planarized insulation layer 120 over the photodiode region and the transistor region. Intermetal insulation layer 130 includes three sequentially stacked insulation films 132, 134, 136.

A wire layer 140 including a plurality of metal wire layers 142, 144, 146 and 148 is formed inside intermetal insulation layer 130. Metal wire layer 142 is formed on planarized insulation layer 120 by penetrating insulation film 132, metal wire layer 144 is formed on insulation film 132 by penetrating insulation film 134, metal wire layer 146 is formed on insulation film 134 by penetrating insulation film 136, and metal wire layer 148 is formed on insulation film 136.

Although wire layer 140 has four (4) layers in the embodiment shown in FIG. 2, the number of layers in wire layer 140 and the number of corresponding layers in intermetal insulation layer 130 can vary.

Insulation films 132, 134, and 136 each typically comprise a film containing oxide, nitride, or oxide and nitride. Wire layer 148 is covered by a passivation layer 150, which also typically comprises a film containing oxide, nitride, or oxide and nitride.

An inner lens 160 is formed in the photodiode region opposite photodiode 104. Preferably, inner lens 160 is a convex lens and is formed on the same plane as metal wire layer 142. Inner lens 160 is formed among the plurality of insulation films 132, 134 and 136 as part of intermetal insulation layer 130. Inner lens 160 preferably comprises an oxide layer.

A transparent optical region 170 covering inner lens 160 is formed by penetrating intermetal insulation layer 130 above inner lens 160. Transparent optical region 170 is formed of a different material from intermetal insulation layer 130. Preferably, transparent optical region 170 is formed of a material having a different refractive index from inner lens 160.

Transparent optical region 170 is typically formed of an organic polymer compound. For example, it may be formed of Cytop™ (Ashahi Glass Company) and a polymethyl methacrylate (PMMA) polymer. Cytop™ is a fluoro polymer having a ring shape. Preferably, a material having a lower refractive index than inner lens 160, such as Cytop™ polymer, is used to form transparent optical region 170.

A planarized layer 172 is formed on transparent optical region 170 and metal wire layer 140. A color filter 180 is formed on planarized layer 172. Planarized layer 172 is formed of the same material as transparent optical region 170.

A micro lens 190 is formed on color filter 180 facing photodiode 104. Micro lens 190 may be formed of a TMR type resin (Tokyo Ohka Kogyo, Co.) or a MFR type resin (Japan Synthetic Rubber Corporation).

In accordance with the embodiment of the invention shown in FIG. 2, a transparent optical path is provided in the pixel sensor by forming convex inner lens 160 as a part of intermetal insulation layer 130 and forming transparent optical region 170 on inner lens 160 of a different material from intermetal insulation layer 130. In particular, transparent optical region 170 is formed of a material having a lower refractive index than inner lens 160. The pixel sensor shown in FIG. 2 is able to concentrate light on photodiode 104 through inner lens 160.

Figure 3:
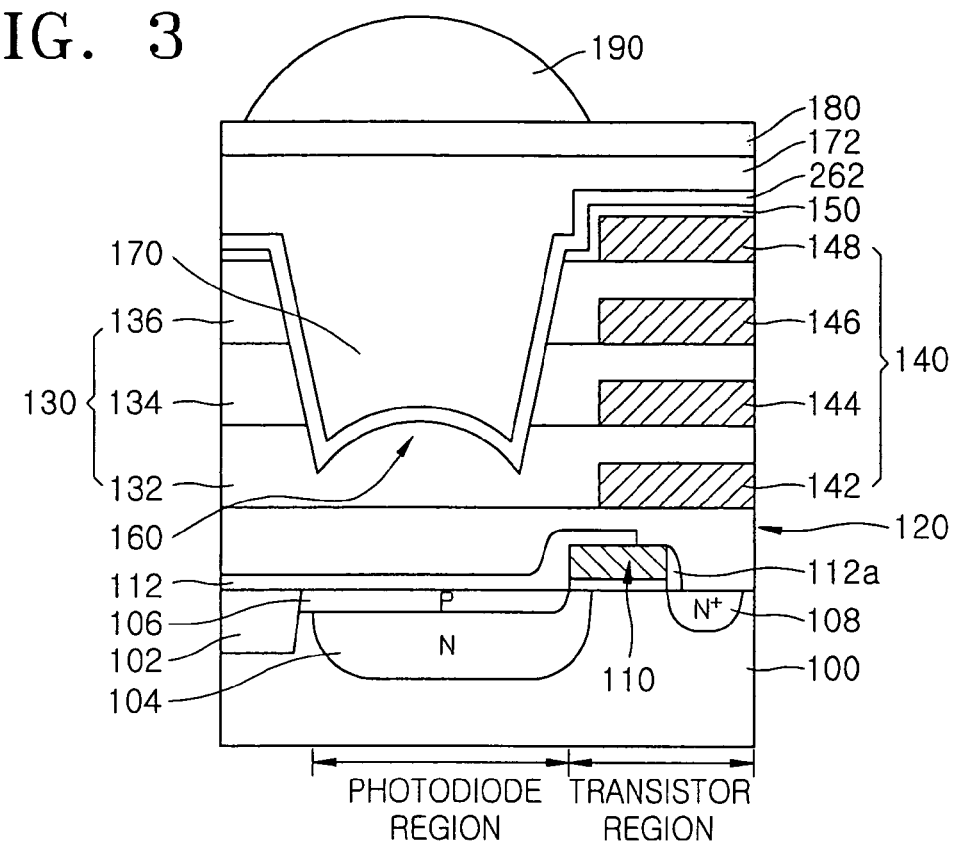
FIG. 3 is a cross-sectional view of the pixel sensor shown in FIG. 1 in accordance with another embodiment of the invention.

FIG. 3 is a diagram of pixel sensor 10 in accordance with another embodiment of the present invention. The pixel sensor shown in FIG. 3 has the same structure as the pixel sensor shown in FIG. 2, except that a transparent optical liner 262 is included between inner lens 160 and transparent optical region 170.

Transparent optical liner 262 is formed along the upper surface of inner lens 160 with the same convex contour as inner lens 160.

Transparent optical liner 262 is preferably formed using silicon nitride, silicon oxide-nitride, or an organic polymer compound. Transparent optical liner 262 is typically formed of a material having a different refractive index from inner lens 160 and transparent optical region 170. Preferably, transparent optical liner 262 is formed of a material having lower refractive index than inner lens 160, and a higher refractive index than transparent optical region 170. For example, where inner lens 160 is formed of an oxide film, transparent optical liner 262 is formed of a Cytop™ type polymer.

In accordance with the embodiment of the invention shown in FIG. 3, the pixel sensor includes inner lens 160, transparent optical liner 262 on inner lens 160 and transparent optical region 170 on transparent optical liner 262. Transparent optical liner 262 and transparent optical region 170 are preferably formed of a material having a lower refractive index than inner lens 160 and transparent optical region 170 is preferably formed with a material having lower refractive index than transparent optical liner 262. Accordingly, a CMOS image sensor having the pixel sensor shown in FIG. 3 provides concentrated light on photodiode 104. Transparent optical liner 262 between inner lens 160 and transparent optical region 170 improves the optical sensitivity of the sensor by concentrating incident light on photodiode 104.

Figure 4:
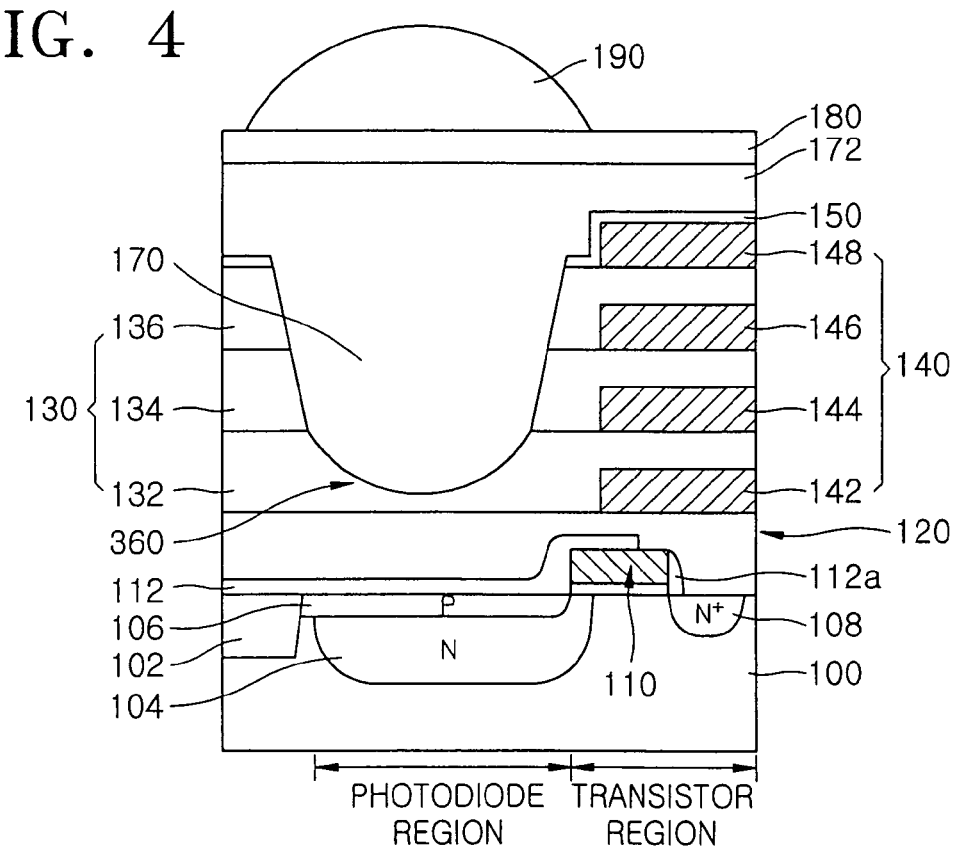
FIG. 4 is a cross-sectional view of the pixel sensor shown in FIG. 1 in accordance with still another embodiment of the invention.

FIG. 4 is a cross-sectional view of the pixel sensor shown in FIG. 1 according to still another embodiment of the invention. The pixel sensor shown in FIG. 4 has the same structure as the pixel sensor shown in FIG. 2, except that inner lens 160 in FIG. 2 is replaced by an inner lens 360 in FIG. 4. Inner lens 360 shown in FIG. 4 is a concave lens.

The pixel sensor shown in FIG. 4 provides a transparent optical path by forming a concave inner lens 360 among insulation films 132, 134, and 136 as a part of intermetal insulation layer 130 and forming transparent optical region 170 on inner lens 360 using a different material from intermetal insulation layer 130. Transparent optical region 170 is preferably formed of a material having a higher refractive index than inner lens 360.

Figure 5:
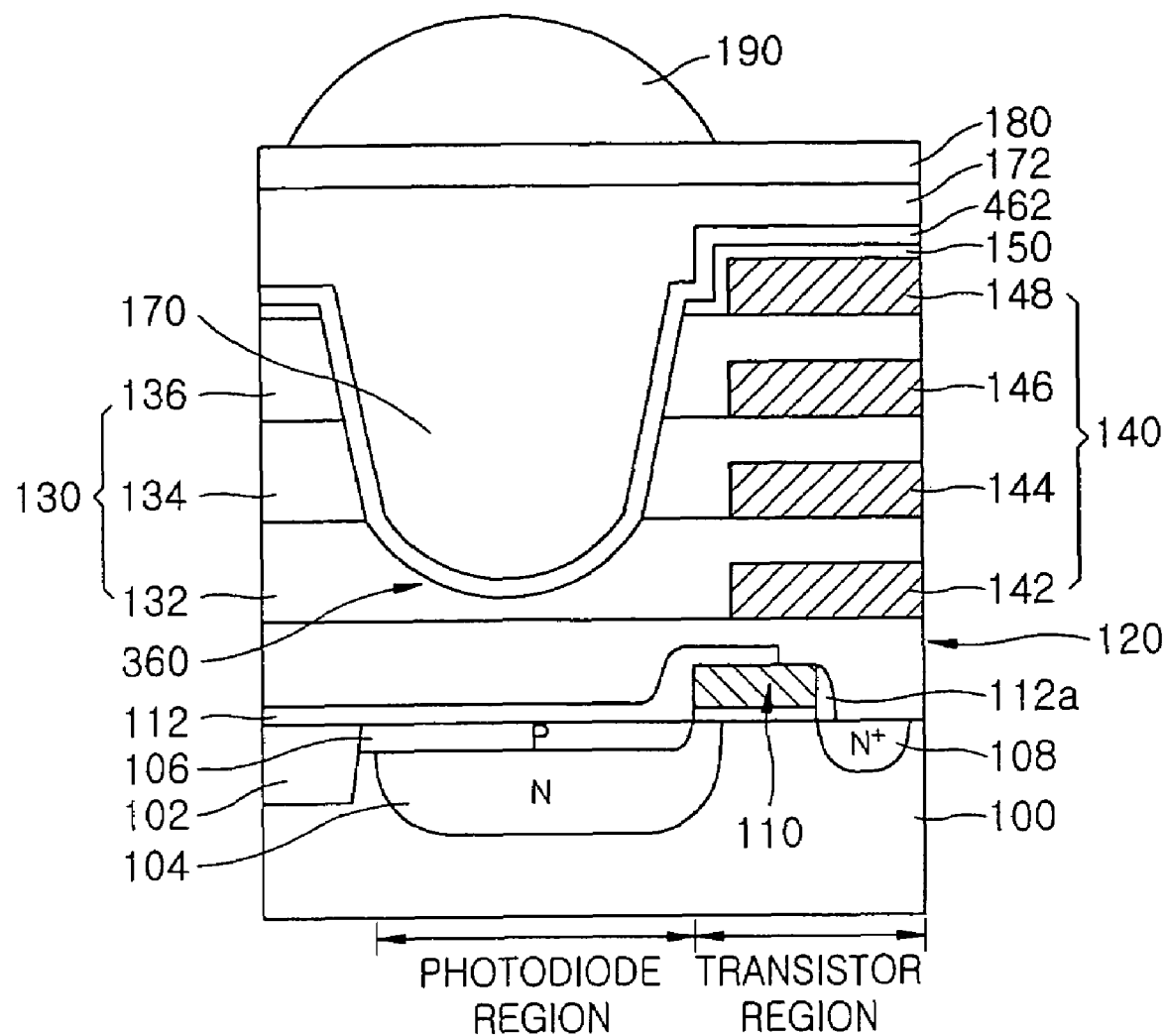
FIG. 5 is a cross-sectional view of the pixel sensor shown in FIG. 1 in accordance with still another embodiment of the invention.

FIG. 5 is a diagram of a pixel sensor in accordance with still another embodiment of the present invention. The pixel sensor shown in FIG. 5 has the same structure as the pixel sensor shown in FIG. 4, except for a transparent optical liner 462 formed between inner lens 360 and transparent optical region 170.

Transparent optical liner 462 is formed with a concave shape on an upper surface of inner lens 360. Transparent optical liner 462 is preferably formed of silicon nitride, silicon oxide-nitride, or an organic polymer compound. In addition, transparent optical liner 462 is preferably formed of a material having a different refractive index from inner lens 360 and transparent optical region 170. Preferably, transparent optical liner 462 is formed of a material having a higher refractive index than inner lens 360 and a lower refractive index than transparent optical region 170. For example, where inner lens 360 is formed of an oxide film, transparent optical liner 462 is formed of silicon nitride, silicon oxide nitride, or a PMMA type polymer.

The pixel sensor shown in FIG. 5 provides efficiently concentrated light on photodiode 104 by forming transparent optical liner 462 between inner lens 360 and transparent optical region 170.

FIGS. 6A through 6D are diagrams illustrating a method of manufacturing a CMOS image sensor in accordance with an embodiment of the present invention.

Figure 6A:
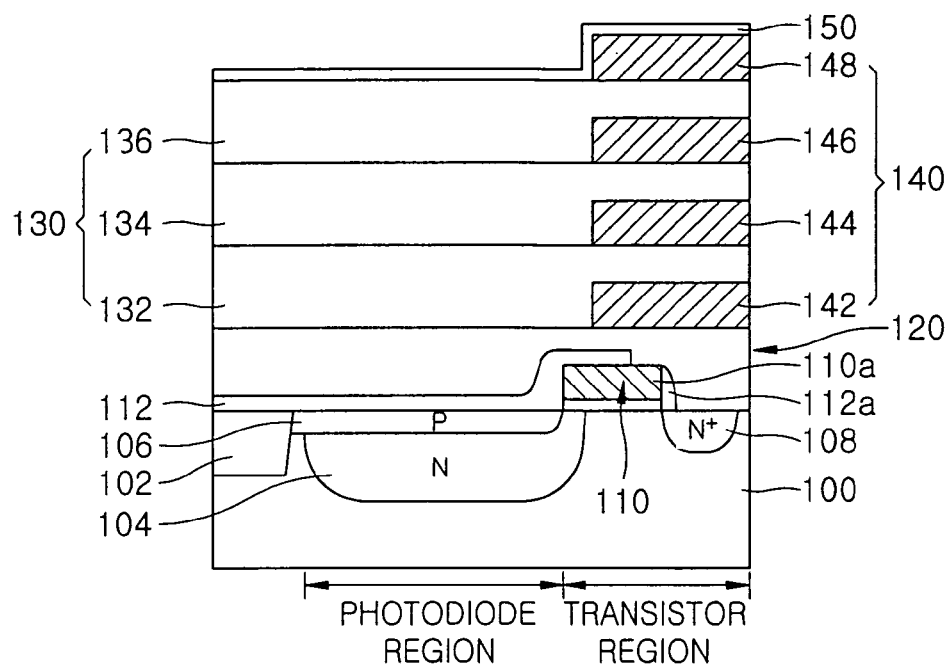
FIGS. 6A through 6D are diagrams illustrating a method of manufacturing a CMOS image sensor in accordance with an embodiment of the present invention.

Referring to FIG. 6A, a semiconductor substrate 100 having a photodiode region and a transistor region is formed. An isolation region 102 is formed on semiconductor substrate 100, thereby defining an active region in semiconductor substrate 100. Then, an "n" type photodiode 104 is formed in the photodiode region on the surface of semiconductor substrate 100. Next, a p+ type HAD region 106 is formed on the "n" type photodiode 104, and a plurality of transistors are formed in the transistor region. For simplicity of illustration, FIG. 6A shows only a single transistor 10.

An insulation spacer 112a is formed at a sidewall of a gate 110a of transistor 110. Insulation spacer 112a is formed by forming an insulation layer 112 to cover the photodiode region and the transistor region after gate 110a is formed in the transistor region. After insulation layer 112 is formed, a mask pattern such as a photoresist pattern (not shown) is formed on insulation layer 112 to cover the photodiode region. Using the mask pattern, insulation layer 112 is etched back to form insulation spacer 112a at the sidewall of gate 110a. After insulation layer 112 is exposed by removing the photoresist pattern, insulation layers are stacked on insulation layer 112 and transistor 110 in the both the photodiode region and the transistor region, thereby forming a planarized insulation layer 120 on insulation layer 112 and transistor 110.

After forming planarized insulation layer 120, an intermetal insulation layer 130 is formed to cover planarized insulation layer 120 in the photodiode region and the transistor region, and a metal wire layer 140 is formed in intermetal insulation layer 130. Intermetal insulation layer 130 comprises a plurality of stacked insulation films 132, 134, and 136 and metal wire layer 140 comprises a plurality of metal wire layers 142, 144, 146, and 148 formed between insulation films 132, 134, and 136.

A passivation layer 150 is formed on intermetal insulation layer 130 and metal wire layer 148. Passivation layer 150 has a stacked structure including an oxide layer of 1500 Å thickness and a nitride layer of 2000 Å thickness.

Figure 6B:
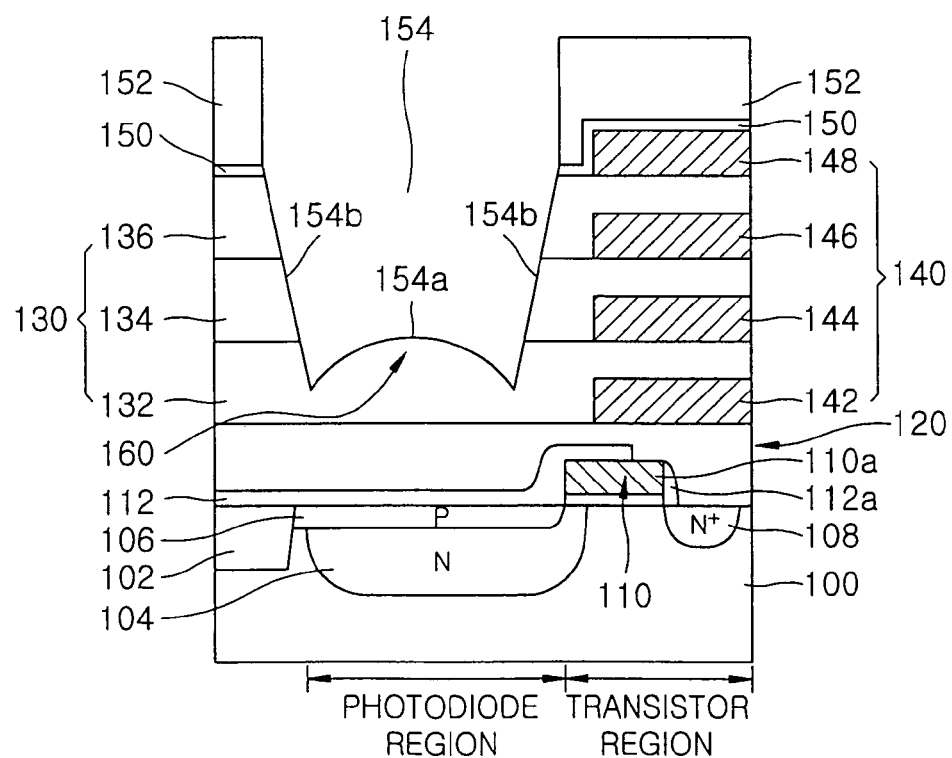

Referring to FIG. 6B, a photoresist pattern 152 is formed on passivation layer 150, thereby exposing a portion of passivation layer 150 in the photodiode region. Passivation layer 150 and intermetal insulation layer 130 are then etched by plasma etching using photoresist pattern 152 as an etching mask, thereby forming a cavity 154 in intermetal insulation layer 130.

Where a target etching region of intermetal insulation layer 130 is formed of only an oxide film, cavity 154 may be formed by plasma etching method using an etching gas including of $C_4F_8$, $O_2$, or Ar. For example, a "Unity85DD" device manufactured by Tokyo Electronics (TEL) may be used for the plasma etching.

A bottom surface 154a of cavity 154 has a predetermined curvature forming an inner lens 160. The profile of bottom surface 154a in cavity 154 is controlled by adjusting a ratio of $O_2$ gas to $C_4F_8$ gas in the etching gas. For example, bottom surface 154a of cavity 154 is made convex by increasing the relative amount of $O_2$ gas in the etching gas. On the other hand, bottom surface 154a of cavity 154 is made concave by increasing the relative amount of $C_4F_8$ gas in the etching gas. Accordingly, in the embodiment shown in FIG. 6B, the $O_2$ content in the etching gas used to form cavity 154 is relatively high. As a result, bottom surface 154a is convex. For example, about 18 standard cubic centimeters per minute (sccm) of $C_4F_8$ gas and about 10 sccm of $O_2$ gas are used to form a planarized bottom surface of cavity 154. For a convex bottom surface 154a, less than 18 sccm of $C_4F_8$ and more than 10 sccm of $O_2$ are used.

Where the target etching region of intermetal insulation layer 130 is formed of a compound film including an oxide film and a nitride film, the cavity 154 is formed by plasma etching using an etching gas comprising $CF_4$, $CH_2F_2$, CO and $O_2$, an etching gas comprising $C_5F_8$, $O_2$ and Ar, or an etching gas comprising $CF_4$, $CH_2F_2$, $O_2$ or CO. For the plasma etching, a parallel flat plate type plasma etching device such as "Unity85SS" from Tokyo Electronics (TEL) is used. The profile of bottom surface 154a of cavity 154 is controlled by adjusting the ratio of $O_2$ gas to carbon gas in the etching gas. That is, bottom surface 154a of cavity 154 is made convex by increasing the relative concentration of $O_2$ gas in the etching gas. Bottom surface 154a of cavity 154 is made concave by increasing the relative concentration of carbon gas.

Cavity 154 is often formed to have a tapered sidewall 154b. Tapered sidewall 154b is typically formed by adding a carbon-rich gas such as CO, $CH_2F_2$, $CHF_3$, or $CH_3F$ to the etching gas.

Where a "Unity85DD" etching device is used to form cavity 154, the plasma etching is carried out with an RF power of about 1700 W and a pressure of about 42 mT.

Where a "Unity85SS" etching device is used to form cavity 154, the plasma etching may be carried out under various different conditions. For example, where a distance between a top electrode and a bottom electrode in the device is about 30 mm, the plasma etching may be carried out with an RF power of about 1500 Ws to 1700 Wb and a pressure of about 30 mT. Alternatively, the plasma etching may be carried out with an RF power of about 2000 Ws and 1900 Wb and a pressure of about 30 mT, or an RF power of about 1000 Ws and 300 Wb and a pressure of about 30 mT.

Figure 6C:
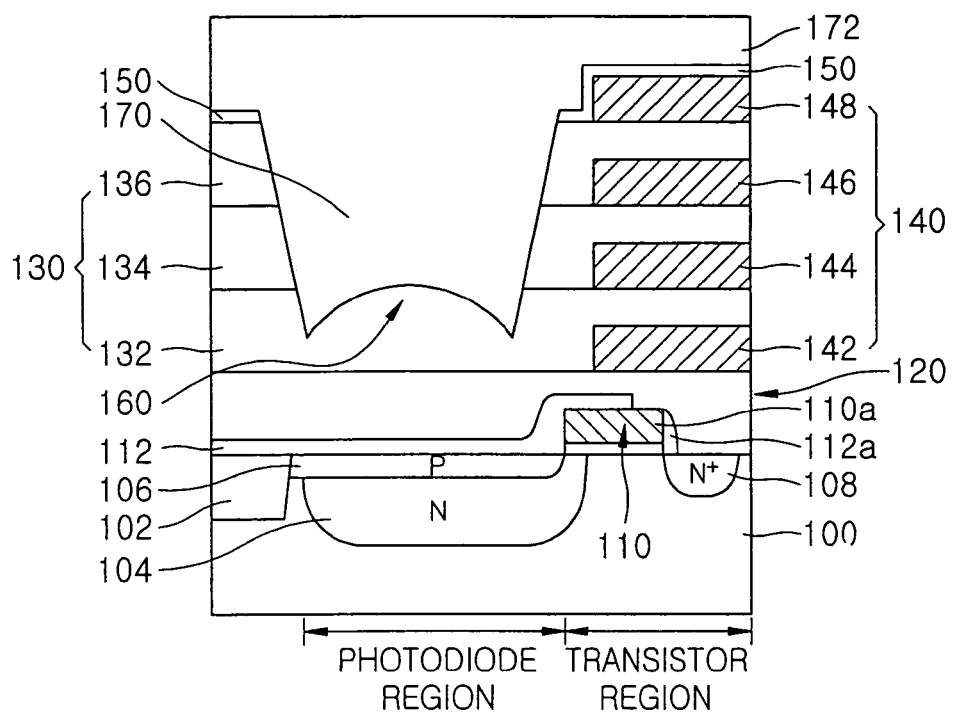

Referring to FIG. 6C, photoresist pattern 152 is removed. Then, a transparent optical material is coated inside of cavity 154 and on passivation layer 150 to form a transparent optical region 170 and a planarized layer 172. Transparent optical region 170 fills cavity 154, and planarized layer 172 covers metal wire layer 140 in the transistor region. Transparent optical region 170 and planarized layer 172 are formed by spin coating. Transparent optical region 170 is typically formed of an organic polymer compound such Cytop™ or a PMMA polymer. For example, where inner lens 160 includes an oxide film formed by chemical vapor deposition, Cytop™ is used to form transparent optical region 170. Cytop™ has a lower refractive index than the oxide film used to form intermetal insulation layer 130. The oxide film has a refractive index of about 1.45 and Cytop™ has a refractive index of about 1.34.

Figure 6D:
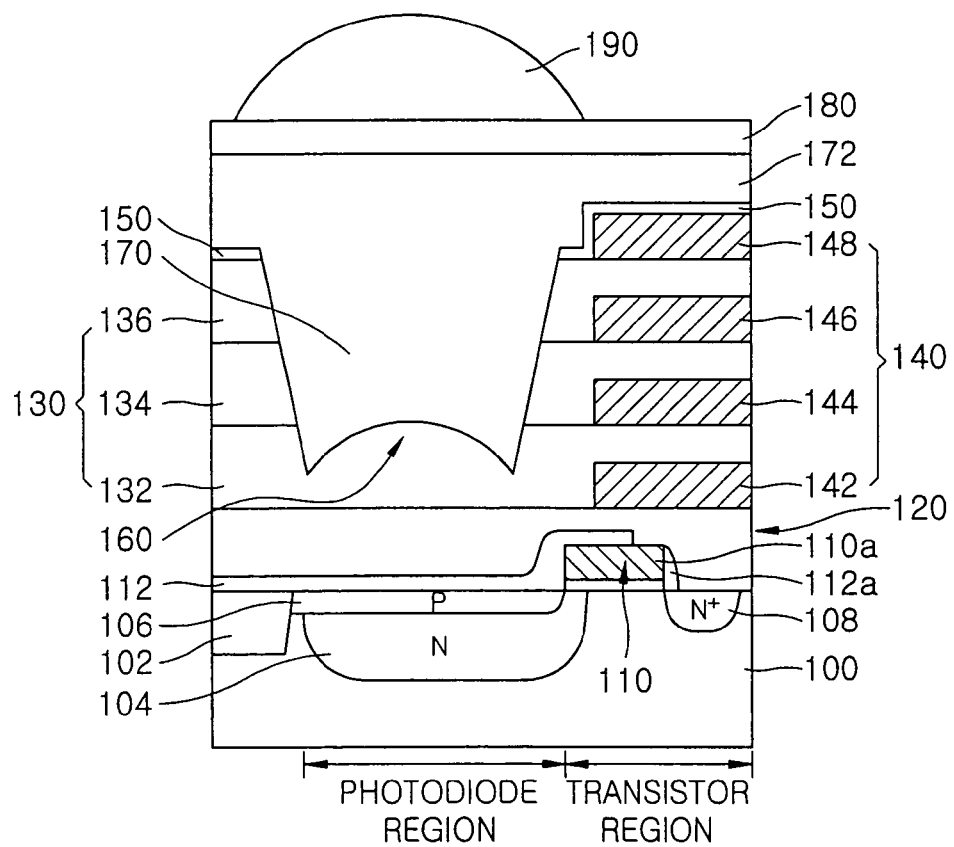

Referring to FIG. 6D, a color filter 180 is formed on planarized layer 172 and a micro lens 190 is formed on color filter 180 above photodiode 104.

Figure 7A:
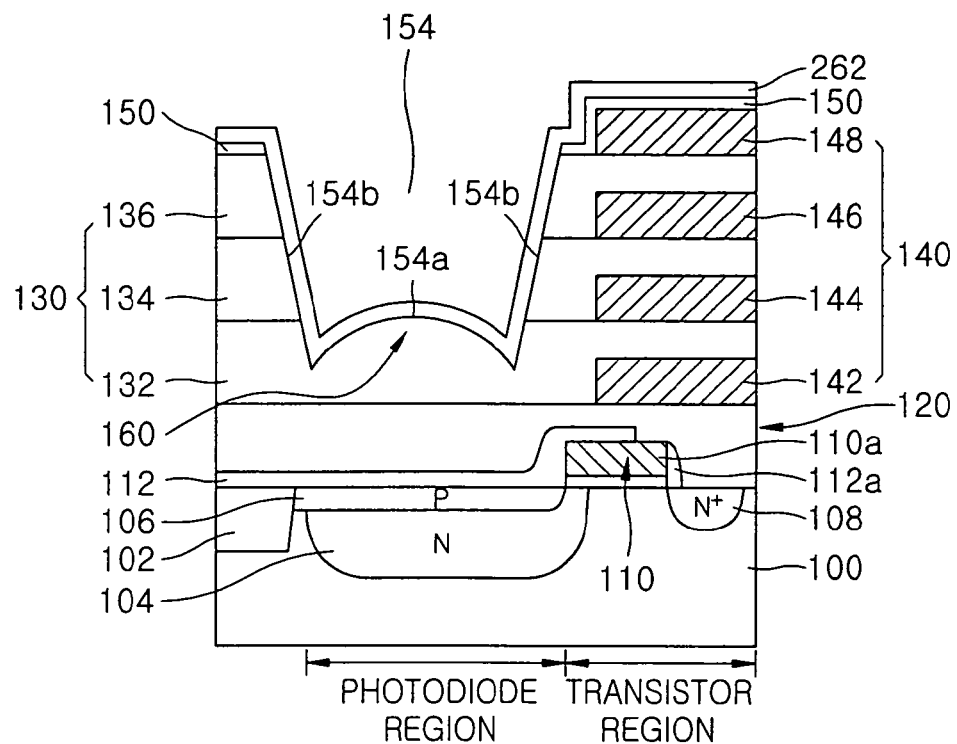
FIGS. 7A and 7B are diagrams illustrating a method of manufacturing a CMOS image sensor in accordance with another embodiment of the present invention.
Figure 7B:
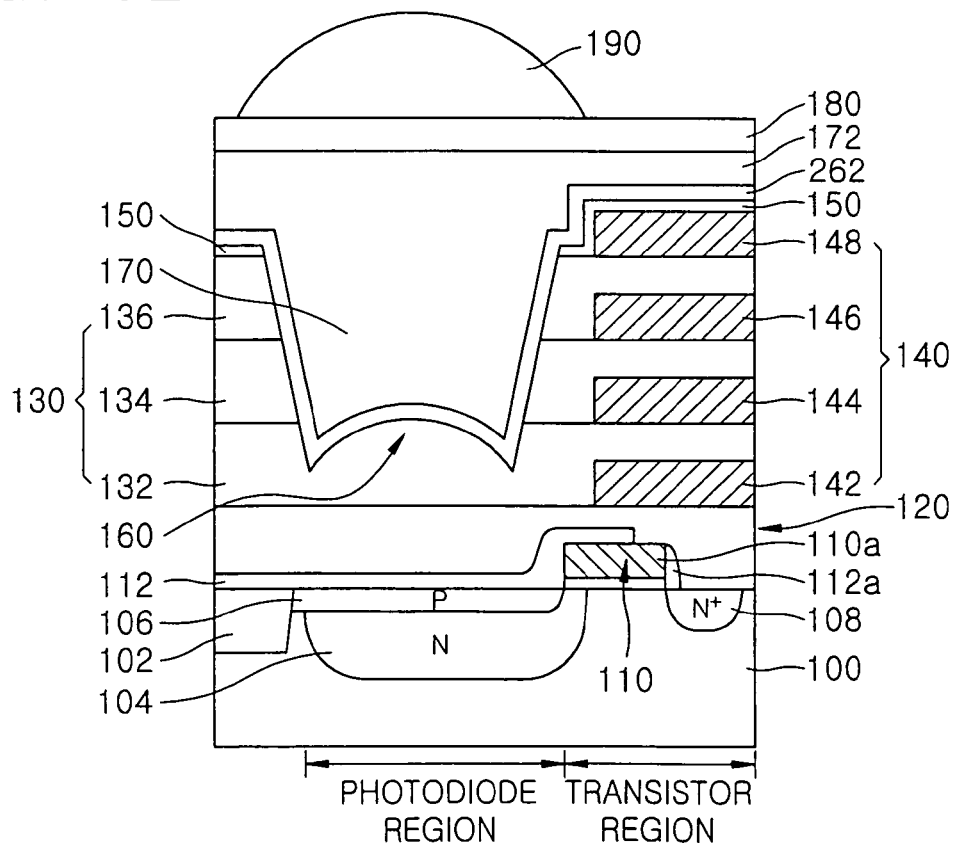

FIGS. 7A and 7B are diagrams illustrating a method of manufacturing a CMOS image sensor in accordance with another embodiment of the present invention.

Referring to FIG. 7A, cavity 154 is formed according to the method described with reference to FIGS. 6A and 6B. Once cavity 154 is formed, photoresist pattern 152 is removed and a transparent optical liner 262 is formed to a predetermined thickness on bottom surface 154a and sidewall 154b of cavity 154. Various properties of transparent optical liner 262 were explained previously with reference to FIG. 3.

Referring to FIG. 7B, a transparent optical region 170 and a planarized layer 172 are formed by coating a transparent optical material on transparent optical liner 262 according to the method explained with reference to FIG. 6C. Once planarized layer 172 is formed, color filter 180 and micro lens 190 are formed on planarized layer 172 according to the method explained with reference to FIG. 6D.

Figure 8A:
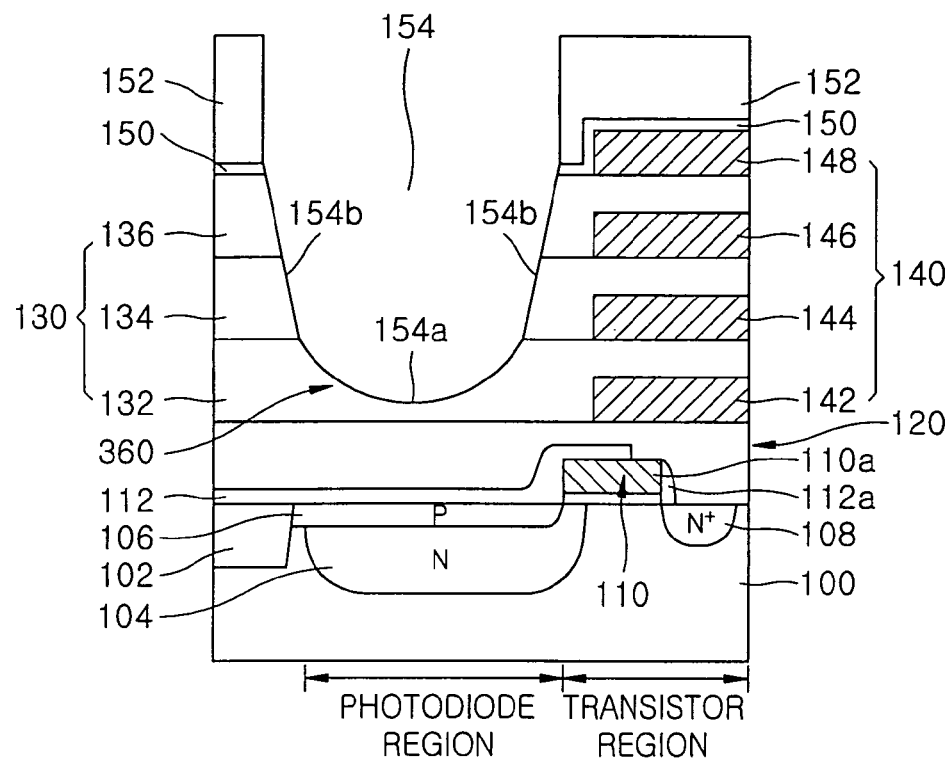
FIGS. 8A and 8B are diagrams illustrating a method of manufacturing a CMOS image sensor in accordance with still another embodiment of the present invention; and, FIGS. 9A and 9B are diagrams of a method for manufacturing a CMOS image sensor in accordance with still another embodiment of the present invention.
Figure 8B:
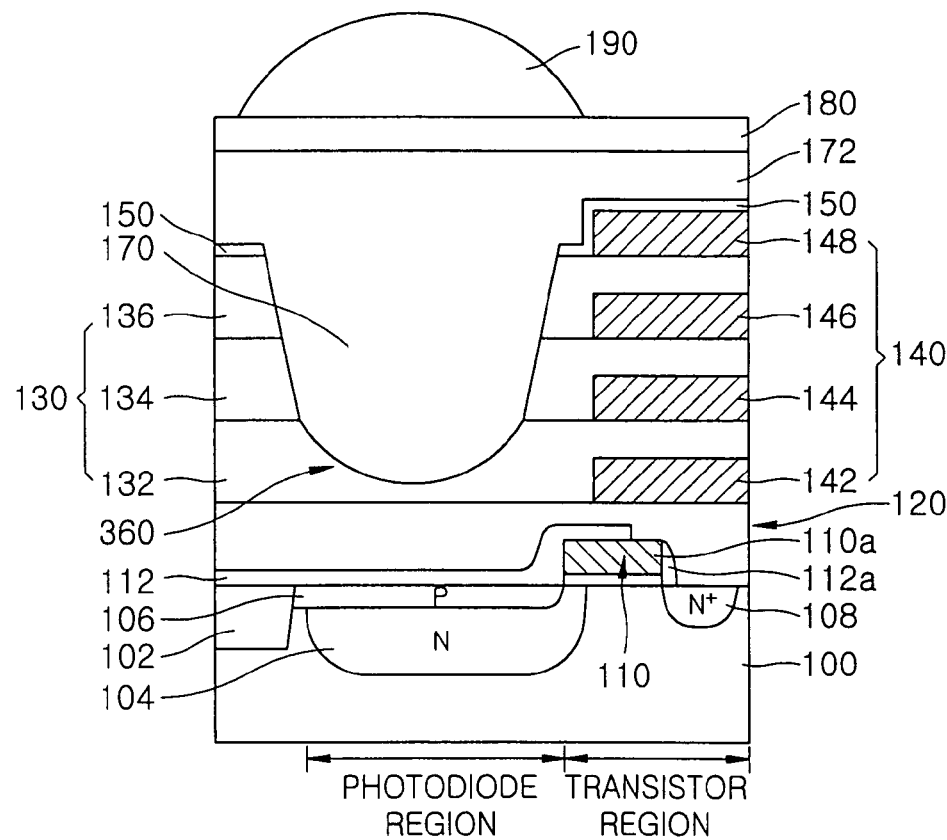

FIGS. 8A and 8B are diagrams of illustrating a method of manufacturing a CMOS image sensor in accordance with yet another embodiment of the present invention.

As shown in FIG. 8A, cavity 154 is formed using the same method described previously with reference to FIGS. 6A through 6D. When forming the cavity 154, the relative concentration of $O_2$ gas in the etching gas is controlled to give the bottom surface 154a a concave shape.

Referring to FIG. 8B, photoresist pattern 152 is removed. After photoresist pattern 152 is removed, transparent optical region 170 and planarized layer 172 are formed inside cavity 154 and on passivation layer 150 by depositing a transparent optical material. Color filter 180 and micro lens 190 are formed on planarized layer 172.

Figure 9A:
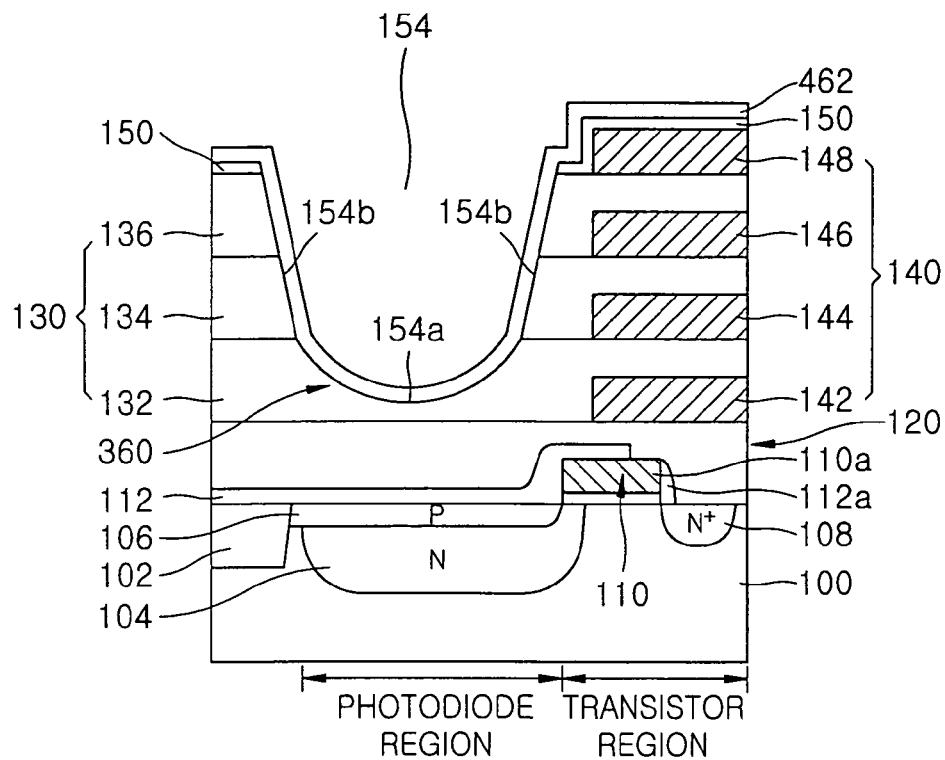
Figure 9B:
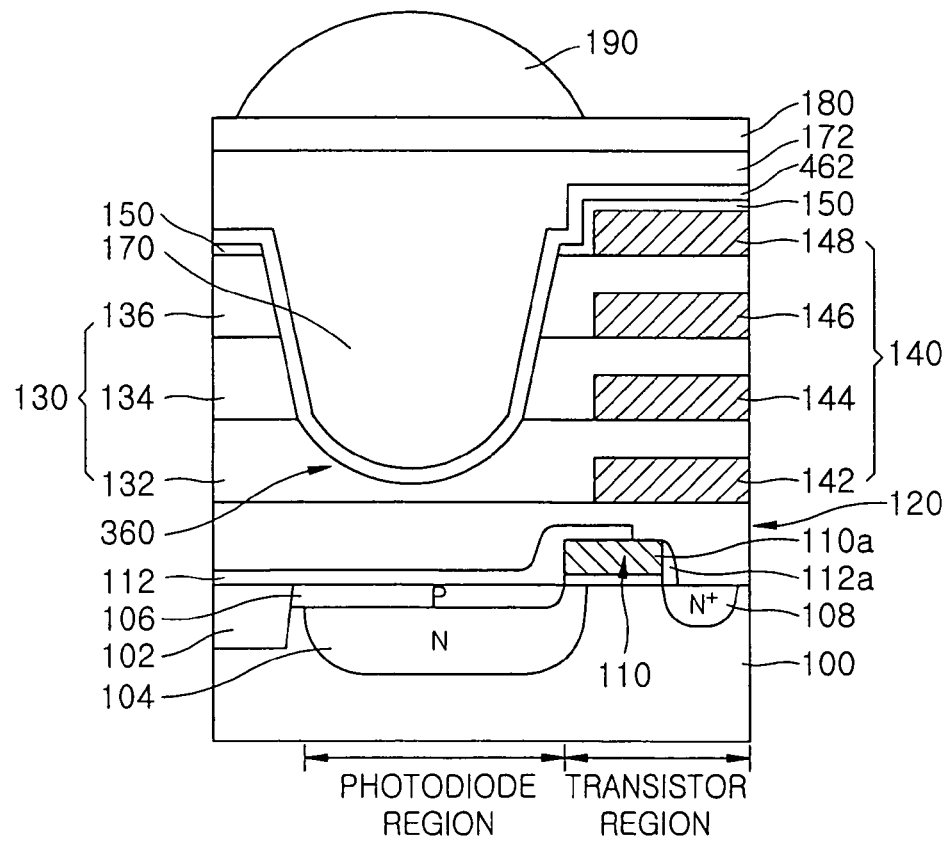

FIGS. 9A and 9B are diagrams illustrating a method of manufacturing a CMOS image sensor in accordance with still another embodiment of the present invention.

Referring FIG. 9A, cavity 154 is formed using methods previously described in relation to FIGS. 6A through 6D. Once cavity 154 is formed, photo-resist pattern 152 is removed using the method explained with reference to FIG. 8A. Next, a transparent optical liner 462 is formed to a predetermined thickness on bottom surface 154a and sidewall 154b of cavity 154.

Referring to FIG. 9B, transparent optical region 170 and planarized layer 172 are formed on transparent optical liner 462 by depositing a transparent optical material according to the method described with reference to FIG. 6C. Then, color filter 180 and micro lens 190 are formed on planarized layer 172 using the method explained with reference to FIG. 6D.

As mentioned above, a CMOS image sensor according to embodiments of the present invention includes a pixel sensor having a convex or concave lens as a part of intermetal insulation layer between the photodiode and the micro lens. The pixel sensor provides a transparent optical path by forming a transparent optical region penetrating an intermetal insulation layer and formed on the inner lens. The transparent optical region is formed of a transparent optical material which is different from a material used to form the intermetal insulation layer. Accordingly, the CMOS image sensor provides effective light concentration on the photodiode. In addition, the CMOS image sensor provides high optical sensitivity by concentrating light, using a transparent optical liner placed between the inner lens and the transparent optical region.

The foregoing exemplary embodiments are teaching examples. Those of ordinary skill in the art will understand that various changes in form and details may be made to the exemplary embodiments without departing from the scope of the present invention which is defined by the following claims.

What is claimed:

1. A method of manufacturing a CMOS image sensor, the method comprising:
   forming a photodiode region and a transistor region in a substrate;
   forming a photodiode in the photodiode region;
   forming a transistor in the transistor region;
   forming a planarized insulation layer covering the photodiode and the transistor;
   forming an intermetal insulation layer covering the planarized insulation layer;
   forming a metal wire layer on the transistor region at least partially within the intermetal insulation layer;
   forming a cavity penetrating the intermetal insulation layer by removing a portion of the intermetal insulation layer over the photodiode region, wherein the cavity comprises a bottom surface having a predetermined curvature forming an inner lens within the intermetal insulation layer; and,
   forming a transparent optical region on the inner lens by filling the cavity.

2. The method of claim 1, wherein the inner lens is a convex lens.

3. The method of claim 1, wherein the inner lens is a concave lens.

4. The method of claim 1, wherein the intermetal insulation layer comprises a film formed from at least one material selected from a group consisting of an oxide and a nitride.

5. The method of claim 4, wherein the inner lens is formed of an oxide film.

6. The method of claim 1, wherein the cavity is formed to have an inclined sidewall.

7. The method of claim 1, wherein the transparent optical region is formed of an organic polymer compound.

8. The method of claim 7, wherein the transparent optical region is formed of a material having a different refractive index from the inner lens.

9. The method of claim 1, wherein the inner lens is a convex lens; and,
   wherein the transparent optical region is formed of a material having a lower refractive index than the inner lens.

10. The method of claim 1, wherein the inner lens is a concave lens; and,
    wherein the transparent optical region is formed of a material having a higher refractive index than the inner lens.

11. The method of claim 1, further comprising:
    forming a planarized layer covering the transparent optical region, the intermetal insulation layer, and the metal wire layer;
    forming a color filter on the planarized layer; and,
    forming a micro lens opposing to the photodiode on the color filter.

12. The method of claim 11, wherein the planarized layer and the transparent optical region are formed of the same material.

13. The method of claim 1, further comprising:
    forming a transparent optical liner on the inner lens before forming the transparent optical region and after forming the cavity.

14. The method of claim 13, wherein the transparent optical liner is formed of a silicon nitride, a silicon oxide-nitride, or an organic polymer compound.

15. The method of claim 14, wherein the transparent optical liner is formed of a material having a different refractive index from the inner lens.

16. The method of claim 13, wherein the inner lens is formed with a convex shape by forming the cavity with a convex bottom surface; and,
    wherein the transparent optical liner is formed of a material having a lower refractive index than the inner lens.

17. The method of claim 13, wherein the inner lens is formed with a concave shape by forming the cavity with a concave bottom surface; and,
    wherein the transparent optical liner is formed of a material having a higher refractive index than the inner lens.

18. A method of manufacturing a CMOS image sensor, the method comprising:
    forming a photodiode region and a transistor region in a substrate;
    forming a photodiode in the photodiode region;
    forming a transistor in the transistor region;
    forming a planarized insulation layer covering the photodiode and the transistor;
    forming an intermetal insulation layer covering the planarized insulation layer;
    forming a metal wire layer on the transistor region at least partially within the intermetal insulation layer;
    applying a plasma etching process using an etching gas including $O_2$ gas and fluorocarbon gas to the intermetal insulation layer to form a cavity in the intermetal insulation layer over the photodiode region, wherein the cavity defines an inner lens from the intermetal insulation layer and the profile of the cavity is defined during the plasma etching by adjusting the ratio of $O_2$ gas to fluorocarbon gas within the etching gas; and
    forming a transparent optical region on the inner lens by filling the cavity.

19. A method of manufacturing a CMOS image sensor, the method comprising:
    forming a photodiode region and a transistor region in a substrate;
    forming a photodiode in the photodiode region;
    forming a transistor in the transistor region;
    forming a planarized insulation layer covering the photodiode and the transistor;
    forming an intermetal insulation layer covering the planarized insulation layer;
    forming a metal wire layer on the transistor region at least partially within the intermetal insulation layer;
    forming a cavity penetrating the intermetal insulation layer by plasma etching a portion of the intermetal insulation layer over the photodiode region, wherein the plasma etching being performed using an etching gas including $O_2$ gas and fluorocarbon gas, and wherein the cavity is formed with a bottom surface having a predetermined curvature forming an inner lens, and wherein the profile of the cavity is defined during the plasma etching by adjusting the ratio of $O_2$ gas to fluorocarbon gas within the etching gas; and
    forming a transparent optical region on the inner lens by filling the cavity.

* * * * *